United States Patent
Clark

(10) Patent No.: US 11,064,611 B2
(45) Date of Patent: Jul. 13, 2021

(54) PATTERNING AND REMOVAL OF CIRCUIT BOARD MATERIAL USING ULTRAFAST LASERS

(71) Applicant: IPG Photonics Corporation, Oxford, MA (US)

(72) Inventor: David C. Clark, Westborough, MA (US)

(73) Assignee: IPG PHOTONICS CORPORATION, Oxford, MA (US)

(*) Notice: Subject to any disclaimer, the term of this patent is extended or adjusted under 35 U.S.C. 154(b) by 351 days.

(21) Appl. No.: 16/024,224

(22) Filed: Jun. 29, 2018

(65) Prior Publication Data

US 2020/0008305 A1    Jan. 2, 2020

(51) Int. Cl.
| | | |
|---|---|---|
| *H05K 3/00* | (2006.01) | |
| *H05K 3/42* | (2006.01) | |
| *H05K 3/46* | (2006.01) | |
| *B23K 26/38* | (2014.01) | |
| *B23K 26/035* | (2014.01) | |

(Continued)

(52) U.S. Cl.
CPC ......... *H05K 3/0038* (2013.01); *B23K 26/035* (2015.10); *B23K 26/355* (2018.08); *B23K 26/38* (2013.01); *B23K 26/386* (2013.01); *H05K 3/0035* (2013.01); *H05K 3/0055* (2013.01); *H05K 3/027* (2013.01); *H05K 3/421* (2013.01); *H05K 3/4652* (2013.01); *H05K 1/0366* (2013.01); *H05K 2203/0554* (2013.01); *H05K 2203/107* (2013.01); *H05K 2203/108* (2013.01)

(58) Field of Classification Search
CPC ................. H05K 3/0038; H05K 3/027; H05K 2203/108; H05K 3/421; H05K 3/0035; B23K 26/355; B23K 26/38; B23K 26/035
See application file for complete search history.

(56) References Cited

U.S. PATENT DOCUMENTS

| | | | |
|---|---|---|---|
| 5,166,493 A | 11/1992 | Inagawa et al. | |
| 5,895,581 A * | 4/1999 | Grunwald | C23F 1/02 216/13 |

(Continued)

FOREIGN PATENT DOCUMENTS

JP    2002118344 A    4/2002

OTHER PUBLICATIONS

Basics of PCBs (What is PCB, Types of PCB, PCB Materials & PCB Software) downloaded from the Internet May 11, 2018, downloaded from.

(Continued)

*Primary Examiner* — Livius R. Cazan
(74) *Attorney, Agent, or Firm* — JDI Patent; Joshua D. Isenberg; Robert Pullman

(57) ABSTRACT

A method for fabricating a printed circuit, comprising: darkening a surface location of a conductive material with one or more ultrafast pulses of laser radiation and ablating the conductive material at the surface location with one or more longer duration pulses of laser radiation to produce traces or micro via patterns on the surface of a PCB. A hole for a blind micro via is produced by ablating the conductive material at the darkened surface location with one or more longer duration pulses of laser radiation and cleaning a second conductive material under the substrate with one or more further longer duration pulses of laser radiation.

28 Claims, 8 Drawing Sheets

(51) Int. Cl.
  *H05K 1/03*     (2006.01)
  *B23K 26/352*   (2014.01)
  *B23K 26/386*   (2014.01)
  *H05K 3/02*     (2006.01)

(56) References Cited

U.S. PATENT DOCUMENTS

| | | | |
|---|---|---|---|
| 5,925,206 | A | 7/1999 | Boyko et al. |
| 2002/0040893 | A1 | 4/2002 | Arai et al. |
| 2006/0091125 | A1 | 5/2006 | Li et al. |
| 2008/0296272 | A1 | 12/2008 | Lei et al. |
| 2009/0057284 | A1* | 3/2009 | Fukuda .............. B23K 26/0608 219/121.72 |
| 2009/0194516 | A1 | 8/2009 | Deshi |
| 2015/0033557 | A1* | 2/2015 | Kotler ...................... H05K 3/26 29/847 |

OTHER PUBLICATIONS

John Ganjei et al, "Digital Inkjet Printing for Etching Circuits", Journal of the HKPCA / Issue No. 30 / 2008/ Q4, MacDermid Electronics Solutions, Waterbury, CT USA 06702.

Miki Kurosawa, "CO2 laser drilling has a central role in manufacturing the newest PCB materials", Laser drilling high-lensity printed circuit boards, Sep. 1, 2012.

R. Barbucha, et al., "Laser Direct Imaging of tracks on PCB covered with laser photoresist", Bulletin of the Polish Academy of Sciences Technical Sciences, vol. 56, No. 1, 2008.

Office Action dated Feb. 20, 2020 for Taiwan Patent Application No. 108116551.

International Search Report and Written Opinion dated Aug. 16, 2019 for International Patent Application No. PCT/US2019/029457.

\* cited by examiner

PATTERNING AND REMOVAL OF CIRCUIT BOARD MATERIAL USING ULTRAFAST LASERS

FIELD OF THE INVENTION

Embodiments of the present invention are related to fabrication of printed circuit boards and more particularly to an improved method of creating fine traces, RDLs (Redistribution Lines) and for drilling micro vias in a printed circuit board or IC Substrate.

BACKGROUND OF THE INVENTION

Modern printed circuit boards (PCB) can be created using a number of different processes. A common process for creating the conductive lines and pad patterns on a PCB is Direct Imaging. In Direct Imaging, a PCB is first treated with a photoactive laminate. The photoactive laminate becomes resistant to a developer when exposed to light. The photoactive laminate is exposed to ultraviolet (UV) laser radiation in the shape of the desired circuit and then washed with the developer. The photo active laminate remains in areas exposed to the UV laser radiation. The PCB with laminate is then exposed to a chemical which is corrosive to the metal layer of the PCB known as an etchant. The laminated areas are resistant to the etchant and the conductive layer under the laminate is not corroded by the etchant. After exposure to the etchant, the laminate is removed leaving the clean conductive metal traces. In some Direct Imaging methods the laminate is exposed to radiation in the form of the circuit through a transparent image mask using a UV lamp. The Direct imaging process uses photo-active laminates, developers and etchants which can be toxic chemicals or corrosive chemicals and the size of the trace is dependent on the photoactive laminate chosen.

Similarly lasers are used to create holes between layers in multi-layered or multisided PCBs called vias. Vias electrically couple one layer to another. There are a multitude of different types of vias, for example the simplest type of via is a through via which is a hole that completely extends from a first conductive layer to a second conductive layer. Another example of a via is a blind via which extends from the first conductive layer to the second conductive layer but stops before piercing the second conductive layer. A third example of via, is a buried via which is hole that electrically couples two layers of the PCB that are covered by other layers of the PCB. A fourth example via is a stacked via which is a hole through multiple layers of the PCB and electrically couples those layers together.

To create these vias the copper surface of the PCB is chemically treated to create a black oxide to reduce reflectivity at the $CO_2$ wavelength of ~10 um. The desired area for the via is then lased using a pulsed carbon dioxide ($CO_2$) laser at near infrared wavelengths of between 9 and 10.6 microns. This first laser pulse removes the top layer of oxide, copper and some substrate material. A second laser pulse from the $CO_2$ laser removes the substrate material down to the next copper layer and a final pulse cleans the second copper layer in the via of any remaining substrate and de-smears the inner copper layer to prepare it for subsequent plating. After the via is created the black or brown oxide layer must be cleaned off and the via must be plated in copper or other conductive materials to ensure an electrical interconnection of the two layers of the PCB. The size of the via created in this process are limited by the long infrared wavelength of the $CO_2$ laser and as such only structures of greater than 50-70 µm are typically possible at production worthy speeds. Another drawback is that this process requires chemically treating the top copper layer to form the black oxide layer which subsequently must be removed.

The drive to higher density interconnects in smart devices necessitates the use of smaller and smaller fine lines and micro via diameters on circuit boards and IC substrates. The inherent hole size limitations of CO2 laser drilling process have driven users to explore direct copper drilling with shorter wavelength lasers such as UV nanosecond pulsed solid state lasers. In this second method of fabricating micro vias the thin outer layer of copper is directly drilled through with a UV laser to create a multitude of small diameter holes. These small apertures can then be irradiated with a CO2 pulsed laser with a larger diffraction limited spot diameter of typically 50-70 microns. The copper layer which is highly reflective at the CO2 laser wavelength acts as a conformal mask and only allows drilling through the small aperture. This two-laser or combi-process technique enables the drilling of plate-able de-smeared blind micro-vias with smaller diameters than achievable using the standard CO2 "black oxide process". However the throughput is compromised and the high price of the UV laser has prevented adoption.

Thus, there is a need in the art, for a technique to quickly create PCB fine traces and smaller micro vias without the need for chemical treatment or UV lasers.

BRIEF DESCRIPTION OF THE DRAWINGS

The teachings of the present disclosure can be readily understood by considering the following detailed description in conjunction with the accompanying drawings, in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
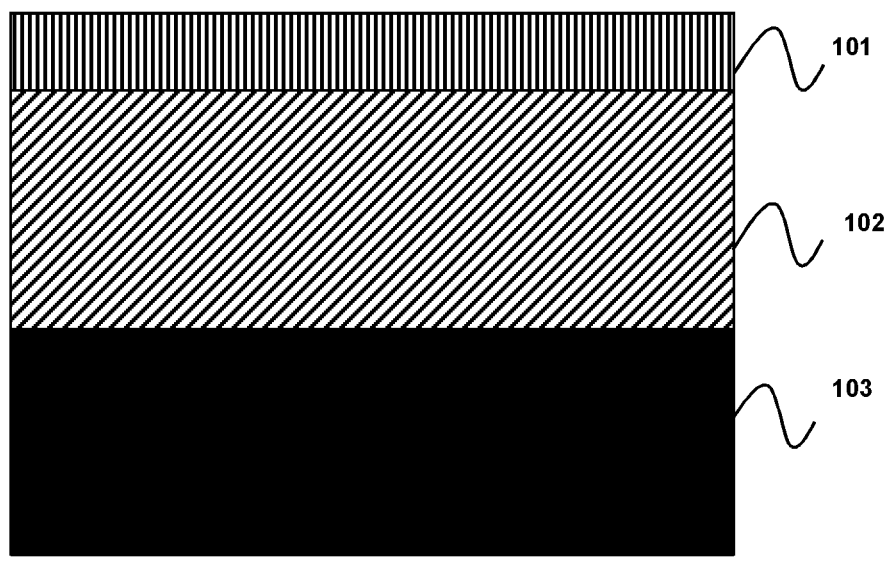
FIG. 1A is a cross sectional diagram of a PCB according to an aspect of the present disclosure.

Circuit trace fabrication according to aspects of the present disclosure may begin with a blank PCB as the initial workpiece. As shown in FIG. 1A, a blank PCB may generally include a conductive material layer 101, a build-up layer or insulative layer 102 and, optionally, a core material layer 103. The conductive material layer 101 may be any conductive material known in the PCB fabrication art but is typically a conductive metal, or metal blend such as copper, nickel, tin, lead, aluminum, silver, gold or any combination thereof. The insulative layer 102 may be made of any non-conductive material known in the PCB fabrication art. Examples of suitable substrates for use as the insulative layer or build layer include organic epoxy resins such as ABF, polyimide materials or woven fiberglass epoxy materials such as FR4, FR2, FR1, CEM-1, CEM-3, and prepreg. The Core 103 may be comprised of a rigid or flexible material chosen to provide strength and tear resistance to the conductive and insulative layers. Typically the core is also a fiberglass epoxy but in some cases may be a metal, ceramic or plastic. Additionally, the Blank PCB may be a double sided, multi-layered PCB. A double-sided PCB is coated with conductive materials on the both substantially planar sides of the board with the insulative layer and optionally the core material separating the two conductive material layers. A multi-layer PCB has two or more conductive material layers separated by the insulative layer or build up layer as shown for example in FIGS. 2A-2D a conductive material 101 disposed on the substantially planar surface of the PCB and a the substrate 102 separates the second conductive material 201 disposed on a insulative or build up layer 202 and below the conductive material 101. Other PCB types that may be used according to aspects of the present disclosure include Flex and Flex-Rigid board types.

Circuit Trace Fabrication

Figure 1B:
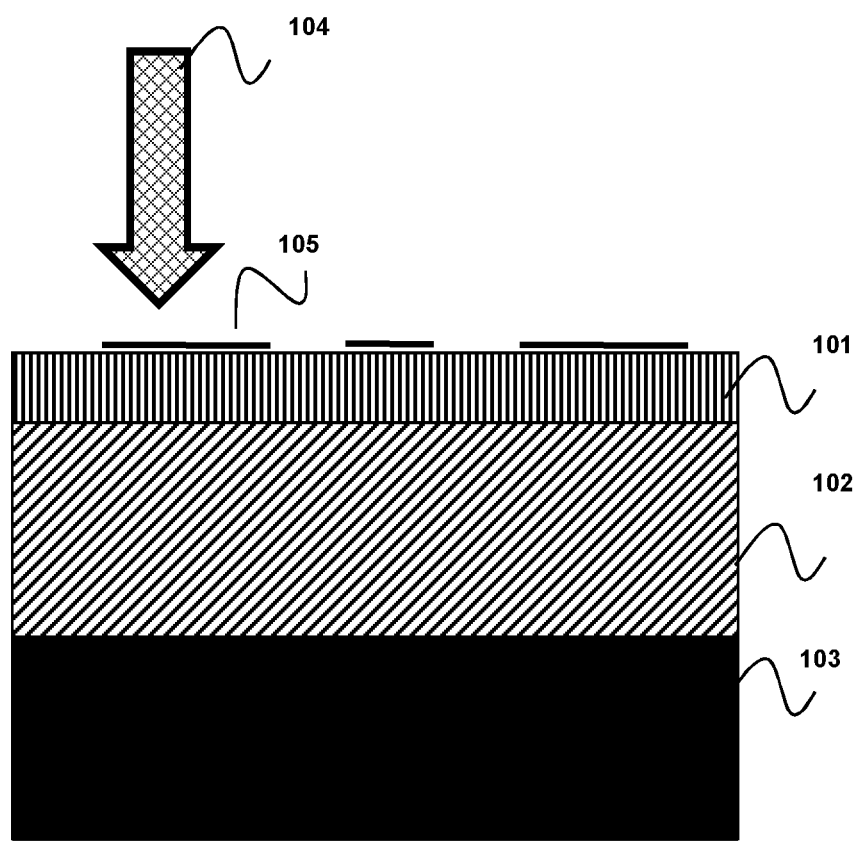
FIG. 1B is a cross sectional diagram depicting creation of darkened traces on a PCB with pulsed radiation according to an aspect of the present disclosure.

Current methods for fabrication of PCB traces and vias require toxic chemical treatments and multiple time consuming steps. This new method uses a two-step process. As shown in FIG. 1B, an ultrafast pulsed laser radiation 104 is used to define the pattern of traces 105 on a conductive material layer. The ultrafast pulsed laser radiation 104 as used herein may refer to a laser having a pulse duration from 100 femtoseconds (fsec) to 100 picoseconds (ps). The ultrafast pulsed laser 104 may be a pulsed laser UV to infrared (IR) with a wavelength ranging from 350 nanometer to 5 micrometers. By way of example, and not by way of limitation, the ultrafast pulsed laser 104 may be an IR laser capable of producing laser pulses characterized by a wavelength of about 1 μm and 2-3 picosecond pulse duration. By way of example and not by way of limitation the IR laser may be a Yb pico-second pulse laser such as an IPG photonics YLPP-25-3-50 Ytterbium pico-second fiber laser.

It is noted that the wavelength of light of a given optical frequency (speed of light in divided by wavelength) is generally a function of the medium in which it travels. The term "wavelength" is often used herein to refer to the "vacuum wavelength" or the wavelength for light of a given frequency in vacuum.

Figure 4:
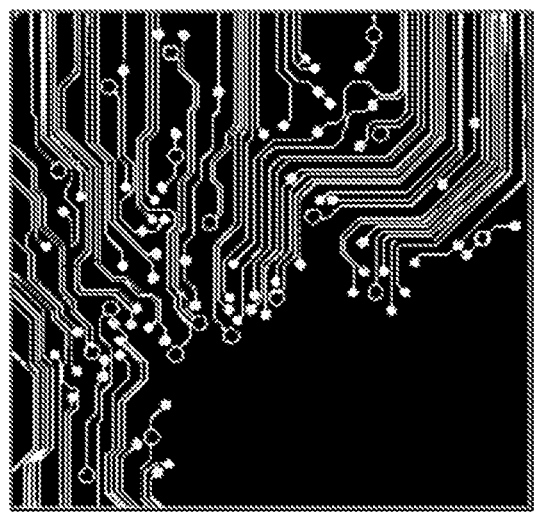
FIG. 4 illustrates an example of a circuit pattern that could be drawn on a metal surface in accordance with aspects of the present disclosure.

The diameter d of the ultrafast pulsed laser spot according to aspects of the present disclosure may be any size but in preferred embodiments is less than 35 μm. The ultrafast pulsed laser 104 may be used at a surface location 105 on the PCB to layout the pattern of circuits and interconnects by darkening portions of the conductive material 101. The ultrafast pulsed laser radiation 104 rapidly creates a digitally defined darkened or black pattern 105 directly on the metal surface 101 without the need for multistep lithography/photoresist process, or expensive UV lasers or lamps. Exposure of the surface of the conductive material 101 to the ultrafast pulsed laser radiation 104 darkens the surface 105 by creating nanostructured ridges and valleys. These nanostructures increase the surface area and reduce the reflectivity of the surface effectively creating an area that appears darker or black. The black areas 105 that have been irradiated by the ultrafast pulsed laser 104 have increased optical absorption that facilitates their subsequent selective removal with radiation pulses of longer duration from a longer wavelength laser. An example of a circuit pattern that could be lased on a metal surface as discussed above is illustrated in FIG. 4.

Figure 1C:
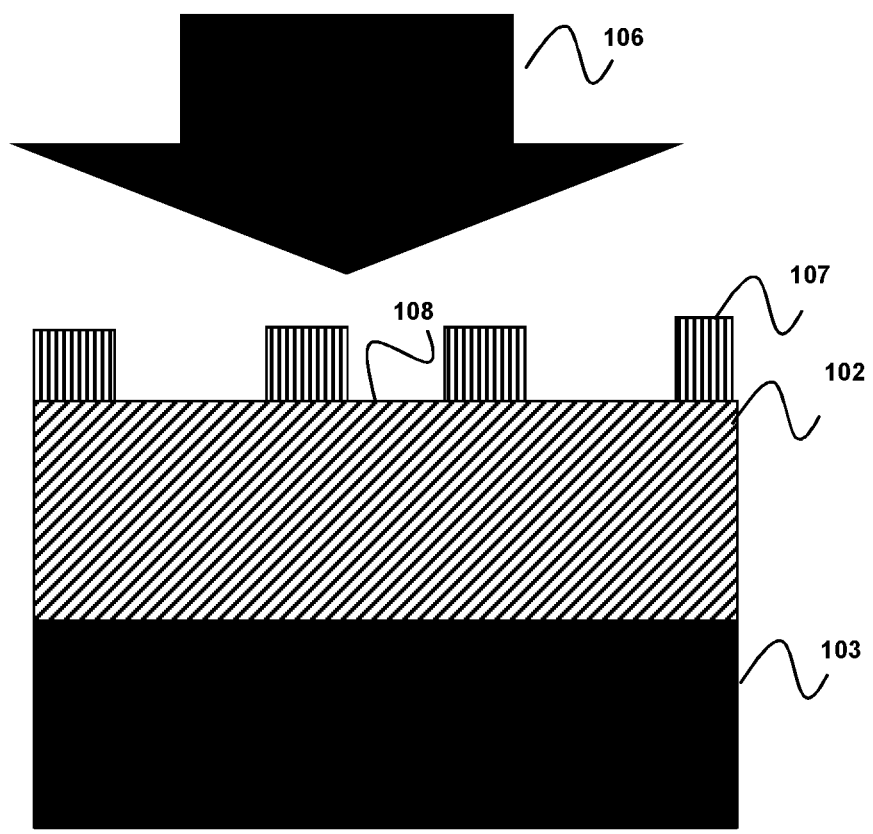
FIG. 1C is a cross sectional diagram depicting the copper layer of a PCB etched with longer duration radiation according to an aspect of the present disclosure.

As seen in FIG. 1C, the combination of the darkened or black patterns 105 created with the ultrafast pulsed laser 104 together with the unmodified highly reflective conductive material 101 creates a "conformal mask" enabling the longer wavelength laser 106 to create trace widths that are smaller than normally achievable with the longer wavelength laser. To create the traces according to aspects of the present disclosure, the darkened or black patterns 105 are irradiated with longer duration pulses from a longer wavelength laser 106. The longer duration of irradiation by the longer wavelength laser 106 ablates the material in the location of darkened or black patterns 108 because of the higher absorptivity and reduced reflectance of the darkened or black patterns. Areas of the conductive material that do not have the darkened or black patterns are not ablated 107 because the conductive material is highly reflective to the longer duration and longer wavelength laser radiation 106. As such it is desirable to choose the wavelength of the longer duration and longer wavelength laser such that the unmodified conductive material 101 is highly reflective of the longer pulse and longer wavelength laser's radiation. The longer duration and longer wavelength laser 106 by way of example and not by way of limitation may have a wavelength ranging from 1 μm to 20 μm. In some embodiments the longer duration and longer wavelength laser 106 is a common industrial laser such as a pulsed carbon dioxide ($CO_2$) laser. In other embodiments the longer duration and longer wavelength laser may be a mid-IR pulsed fiber laser or a carbon monoxide (CO) laser for resin ablation. After ablation of the surface material the PCB with traces may be cleaned, de-smeared and plated or finished with solder mask and silkscreened images or text.

This two stage technique of fast patterning with ultrafast pulsed high repetition rate laser followed by macro removal with a $CO_2$ laser retains the advantages of the existing Laser Direct Imaging process with respect to digital patterning of circuitry, and the flexibility this affords to layer alignment etc. In addition this new two stage high volume manufacturing process also eliminates the need for expensive photoresists and chemical etchants which are currently employed to remove the patterned conductive layer. Since the ultrafast pulsed laser elegantly provides this.

Laser Fabrication of Vias

Figure 2A:
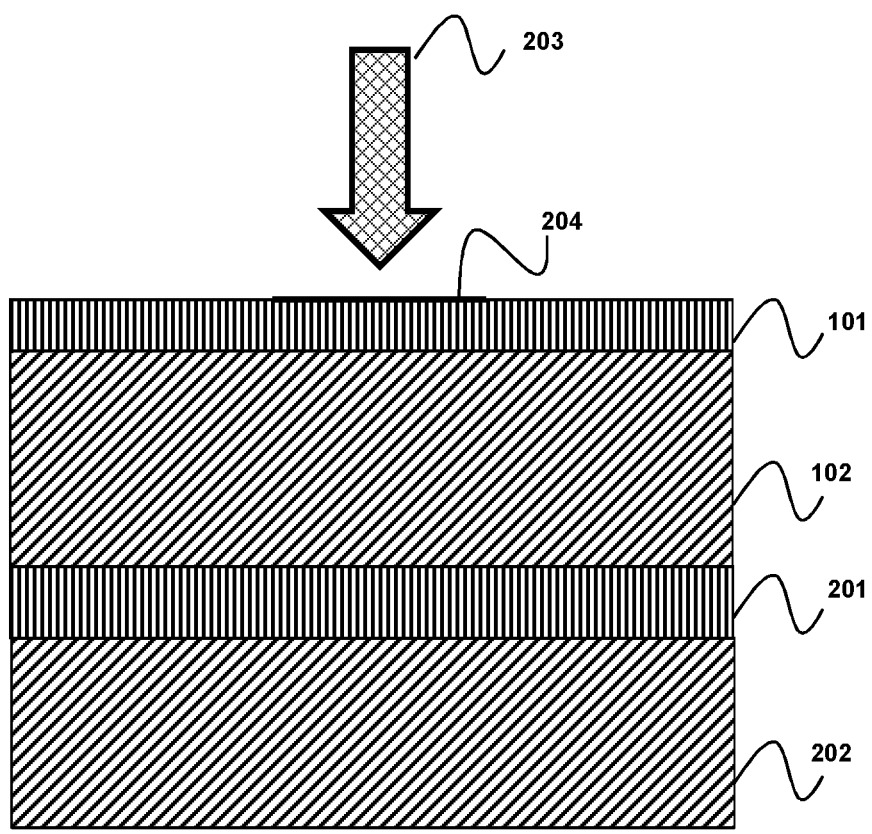
FIG. 2A is a cross sectional diagram showing creation of a darkened area for a via in a multi-layer PCB with pulsed radiation according to an aspect of the present disclosure.

Vias are holes from one conductive layer of the PCB to another conductive layer. Generally a via electrically couples the two layers by coating the sides or filling the hole of the via with a conductive material. As shown in FIG. 2A the fabrication of vias starts out initially with a double sided or multi-sided PCB having a conductive material layer 101 and a second conductive material layer 201 separated by an insulative layer 102. The ultrafast pulsed laser irradiates 203 a surface location of the blank copper board PCB creating the darkened or black pattern 204 for a via. As discussed above the darkened or black pattern increases the absorptivity and reduces to the reflectivity of the conductive material to longer wavelength radiation.

Figure 2B:
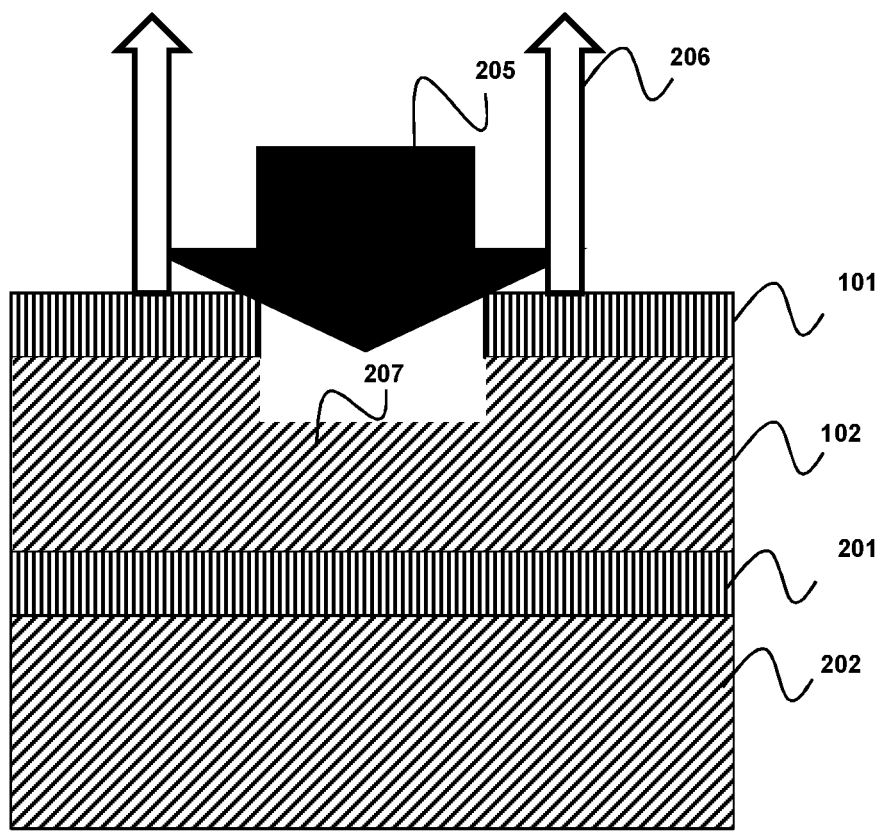
FIG. 2B is a cross sectional diagram showing the upper copper layer and some substrate of the multi-layer PCB ablated with the first pulse from the longer duration pulse and longer wavelength laser radiation according to an aspect of the present disclosure

In next step as depicted in FIG. 2B the darkened or black pattern 204 is exposed to radiation from a longer pulse duration and longer wave length laser 205. As described above, the longer duration and longer wave length laser 205 may for example and without limitation be a $CO_2$ laser. The longer duration and longer wave length laser 205 ablates the conductive material 101 as well as some of the substrate material 102 in the area that was darkened or black 204. In areas that were not darkened or black the longer duration and longer wave length laser is reflected 206 without ablating the conductive material. After this first exposure a small hole 207 is produced in the conductive material 101 and some substrate material 102 may be removed as well. Insulating layer materials, unlike the conductive materials, generally have low reflectivity and high absorptivity to the commonly used $CO_2$ wavelengths of industrial lasers (but glass fibers cause problems for UV). A benefit of this process over existing via creation processes is that the positional accuracy of the longer pulse duration and longer wavelength laser radiation is not required to be as highly accurate. As long as the longer pulse duration and longer wavelength laser radiation spot overlaps the blackened pattern a hole will be created in the precisely defined location without harming the unmodified conductive material.

Figure 2C:
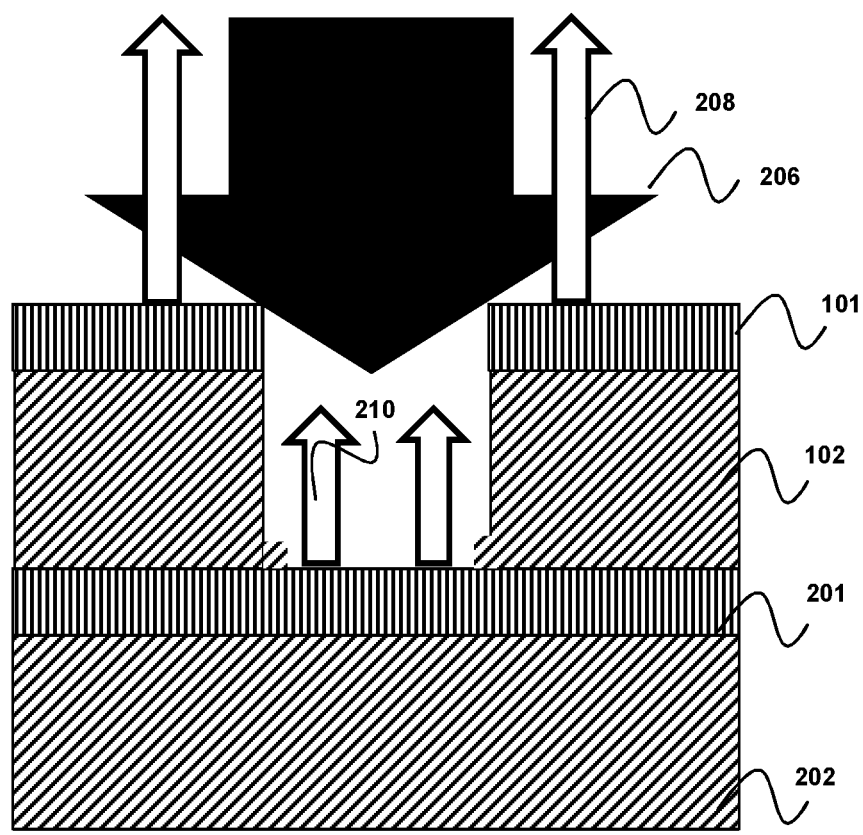
FIG. 2C is a cross sectional diagram showing removal of substrate of the multi-layer PCB with longer duration pulses and longer wavelength radiation according to an aspect of the present disclosure

As shown in FIG. 2C the small hole 207 created through the conductive material 101 and in to the insulating material 102 is irradiated with a second pulse of the longer duration and longer wave length laser radiation 209. This pulse pierces through the remaining insulating material 102 to the second conductive layer 201. Any additional radiation from the longer duration and longer wave length laser is reflected 210 off the highly reflective surface of the second conductive layer 201. As before any radiation not in a darkened or black pattern location on the surface conductive material layer 101 is reflected 208.

Figure 2D:
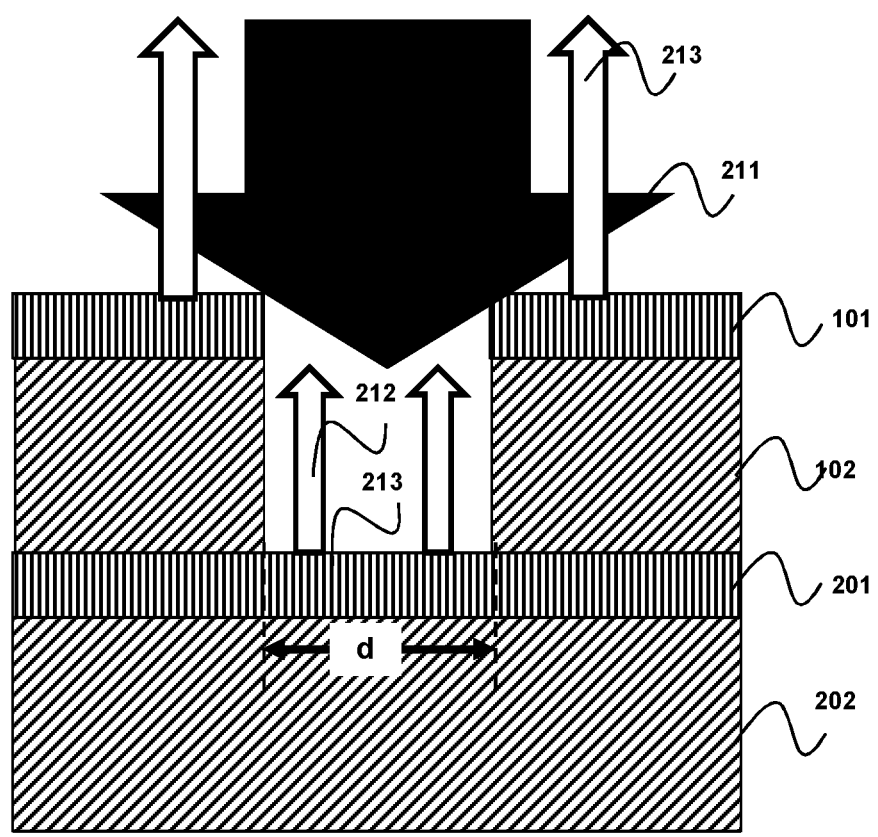
FIG. 2D is a cross sectional diagram showing the cleaning and de-smearing the second conductive material layer of a multi-layer PCB with longer wavelength and longer pulse duration radiation according to an aspect of the present disclosure

Finally as FIG. 2D depicts the surface location of darkened or black pattern 204 is exposed to the radiation 211 from the longer duration and longer wave length laser for a third time. Any radiation not in the location of the darkened or black pattern is simply reflected 213. The radiation 211 cleans the second conductive material layer 201 of any remaining substrate 102 and de-smears the surface of the second conductive material 201 in the exposed location. Once cleaned and polished the exposed surface of the second conductive material 201 becomes reflective and reflects 212 the remaining radiation not absorbed by ablating the remaining substrate. Thus, this hole cleanout process creates a blind hole in the surface of the PCB from one conductive layer 101 to a second conductive layer 201. The hole may be finished by electrically coupling the conductive layer and the second conductive layer using a third conductive material to create a blind micro via. The interior walls of the hole may be plated or filled with a conductive material such as a conductive metal or metal blend. The conductive metal or metal blend may by way of example and not by way of limitation be copper, nickel, tin, lead, aluminum, silver, gold or any combination thereof.

With the above disclosed method a via of any layer depth may be created through iterative repetition of the build-up PCB lamination process. By way of example and not by way of limitation a four layer deep via may be created.

This two stage technique of fast patterning with ultrafast pulsed high repetition rate laser followed by macro removal with a $CO_2$ laser retains the advantages of the existing laser direct drilling process with respect to micro via hole shape, integrity, plating compatibility etc. This new high volume manufacturing process also eliminates the need for the black/brown copper oxide step which is currently employed to modify the wavelength absorption of the bare copper prior to drilling with the long wavelength $CO_2$ laser and allows the creation of via holes less than 35 μm in diameter. Since the ultrafast pulsed laser elegantly provides this.

Implementation

Figure 3:
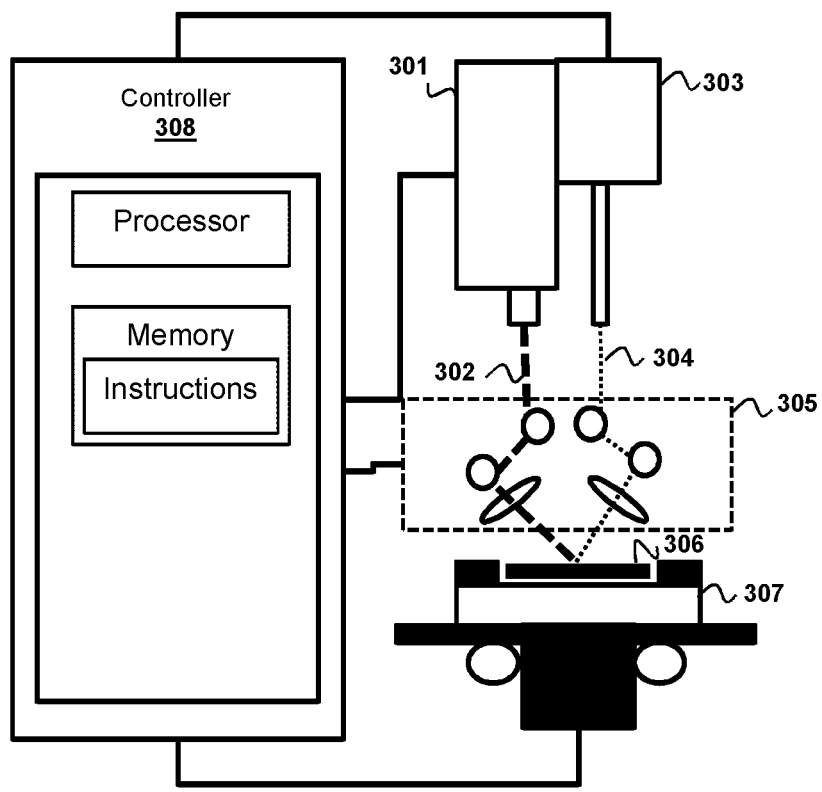
FIG. 3 is a diagram depicting the two laser micro-via drilling system according to an aspect of the present disclosure.

The methods for fabrication of circuit traces and micro vias according to aspects of the present disclosure may be implemented using a two laser-system as shown in FIG. 3. The two-laser system may comprise an ultrafast pulsed laser 303 and a longer duration and longer wavelength laser 301. Laser is an acronym of light amplification by stimulated emission of radiation. A laser is an optically resonant cavity formed by two reflecting surfaces. One of the reflecting surfaces allows a small portion of the radiation striking it to escape. The cavity contains a lasable material, sometimes called a gain medium. The gain medium may be any suitable material—crystal, glass, liquid, semiconductor, dye or gas—containing atoms capable of being excited to a metastable state by pumping e.g., by light or an electric discharge. Light is emitted from the metastable state by an atom as it drops back to the ground state. The light emission is stimulated by the presence by a passing photon, which causes the emitted photon to have the same phase and direction as the stimulating photon. The light (referred to herein as stimulated radiation) oscillates within the cavity.

The wavelength of the stimulated radiation depends on the choice of gain medium. Consequently, lasers are often described in terms of the gain medium used. For example, a $CO_2$ laser uses carbon dioxide ($CO_2$) gas as a gain medium. A fiber laser uses an optical fiber doped with rare-earth elements such as erbium, ytterbium, neodymium, dysprosium, praseodymium, thulium and holmium as the gain medium. A fiber laser often uses Fiber Bragg gratings as reflectors to form the resonant cavity.

Pulsing of the light from the resonant cavity may be accomplished, e.g., by pulsing the seed radiation or pumping energy. In some implementations, depending on the desired pulse characteristics, pulsing may be accomplished optically, e.g., by Q-switching or mode locking. For example, it is relatively easy to actively Q-switch a $CO_2$ laser by means of a rotating mirror or an electro-optic switch, giving rise to Q-switched peak powers of up to gigawatts (GW).

Q-switching rapidly changing the Q of an optical resonant cavity. Q refers to the figure of merit of the cavity, defined as $(2\pi) \times$(average energy stored in the resonator)/(energy dissipated per cycle). The higher the reflectivity of the surfaces of an optical resonator and the lower the absorption losses, the higher the Q and the less energy loss from the desired laser mode. A Q-switched laser uses a Q-switch in the laser's resonant cavity to prevent lasing action until a high level of inversion (optical gain and energy storage) is achieved in the lasing medium. When the switch rapidly increases the Q of the cavity, e.g., with acousto-optic or electro-optic modulators or saturable absorbers, a giant pulse is generated.

Mode-locking utilizes constructive Interference between different modes of a laser's resonant cavity to cause the laser light to be produced as a train of pulses. A laser operating in this fashion referred to as 'phase-locked' or 'mode-locked'. Since light is a wave, when bouncing between the mirrors of the resonant cavity, the light will constructively and destructively interfere with itself, leading to the formation of standing waves or modes between the mirrors. These standing waves form a discrete set of frequencies, known as the longitudinal modes of the cavity. These modes are self-regenerating and can oscillate in the resonant cavity. Other frequencies of light are suppressed by destructive interference. A mode-locked laser functions by controlling the relative phase (sometimes through modulation with respect to time) of each mode internally to give rise selectively to energy bursts of high peak power and short duration, e.g., in the picosecond ($10^{12}$ second) domain.

As discussed above the ultrafast pulsed laser 303 may have a pulse duration from 100 femtoseconds to 100 picoseconds. The ultrafast pulsed laser 303 may be emit radiation 304 ranging from the UV to infrared (IR) spectrum with a wavelength ranging from 300 nanometer to 5 micrometers. By way of example and not by way of limitation, a NdYAG laser typically emits radiation of around 1064 nm, which can be considered to be about 1 μm. Preferred embodiments of the present disclosure are pulsed IR fiber lasers having a wavelength 1 μm and a 2-3 picosecond pulse duration. The ultrafast pulsed laser may have spot size of less than 50 um and typically 30-25 μm. The peak power of the ultrafast pulsed laser may be greater than 10 MW. The longer duration and longer wavelength laser 301 according to aspects of the present disclosure may emit laser radiation 302 having a wavelength ranging from 9 μm to 10.6 μm. In exemplary embodiments the longer duration and longer wavelength laser is a common industrial laser such as a carbon dioxide ($CO_2$) laser. In other embodiments a modified $CO_2$ pulse laser maybe used. Modified $CO_2$ pulse lasers may be TEA-$CO_2$, High-peak/Short Pulse $CO_2$ Lasers or Enhanced $CO_2$ lasers. The longer pulse duration and longer wavelength laser may have a repetition rate of around ten kilohertz with a pulse duration ranging from a nanosecond to about 10 milliseconds.

As used herein the term pulse duration refers to the temporal duration or lifetime of a repetitive signal, e.g., the time interval between the half-power points on the leading and trailing edges of the pulse. Pulse duration is sometimes referred to as "pulse width". Pulse energy refers to the amount of energy in a pulse. Pulse energy may be calculated by integrating instantaneous pulse power over the pulse period. Pulse period (T) refers to the time between equivalent points of successive pulses in a train of two or more pulses. Pulse repetition frequency (PRF) refers to the rate of repetition of pulses per unit time. The PRF is inversely related to the period T, e.g., PRF=1/T.

The two laser system may include optics 305 to control and focus the laser radiation on to a workpiece 306. Optics 305 may include sufficient mirrors and lens to focus the ultrafast pulsed radiation 304 and the longer wavelength radiation 302. The optics 305 may also include devices to cause the scanning of the radiation such as mirror galvanometers, electro-mechanical mirrors, refractive prisms electro-optic deflectors and the like. In some implementations, the optics 305 may be configured to scan the radiation from the lasers 301, 303 across the workpiece 306 in a pattern as discussed with above with FIGS. 1A-C and FIG. 4 or to develop a via as disclosed by FIGS. 2A-D. The optics may also include scanners, beam deflectors, apertures, filters and choppers, optical amplifiers, Q-switches, Acousto-Optic Modulators (AOMs) or EOM for controlling the intensity, shape, position and pulse characteristics of radiation produced by the lasers 301, 303. The optics 305 may further comprise homogenizers, apertures, collimators or any combination thereof, which may be used to shape the spatial distribution of the energy density of the laser radiation. By way of example and not by way of limitation the combination of homogenizers, apertures and collimators may shape the energy distribution of the laser radiation for each laser into a homogenous top hat type shaped distribution. In some embodiments of the present disclosure only one laser in the two laser system has a shaped energy distribution.

The two laser system may further comprise a stage 307 for holding the workpiece 306. In some embodiments of the present disclosure the stage 307 is a movable stage configured to traverse or rotate the workpiece 306 about the focus point of the radiation. The movable stage may be a motorized stage with sufficient gearing to move the workpiece 306. The stage 307 may further comprise clamps, mounting brackets, or a chuck (e.g., a vacuum chuck, magnetic chuck, or electrostatic chuck) to securely hold or fasten the workpiece 306 to the surface of the stage.

As discussed with respect to FIGS. 1A and 2A, the workpiece 306 may be a PCB of any type with at least one conductive metal surface. The workpiece 306 may include notches or holes for mounting the subject to the stage.

The two laser system according to aspects of the present disclosure may be controlled by a laser controller 308 operably coupled to the lasers 301, 303 optics 305 and stage 307. By way of example and without limitation the laser controller may be operatively coupled by serial cables, Universal Serial Bus (USB) cable, D-sub cable, or bus bars to the other components in the system. The laser controller 308 may include a processor and memory and be configured, e.g., by suitable programming of the processor to cause the lasers 301, 303 optics 305 and stage 307 to implement the method for fabrication of traces described in FIGS. 1A-C and the method of fabrication of via described in FIG. 2A-D. In some embodiments of the present disclosure the laser controller 308 is a computerized controller with the method embodied in control logic which causes the system to carry out the described methods. In other embodiments the laser controller 308 is a general purpose computer with the described methods embodied on a non-transient computer readable medium that when executed cause the general purpose computer to become specialized computer. The specialized purpose computer configured to cause the system carry out the described methods. In other embodiments the laser controller 308 is an electro mechanical controller with sufficient electrical and/or mechanical logic to cause the system to carry out the described methods.

In the interest of clarity, not all of the routine features of the implementations described herein are shown and described. It will be understood by those skilled in the art that in the development of any such implementations, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of the present disclosure.

In accordance with aspects of the present disclosure, the components, process steps, and/or data structures may be implemented using various types of operating systems; computing platforms; user interfaces/displays, including personal or laptop computers, video game consoles, PDAs and other handheld devices, such as cellular telephones, tablet computers, portable gaming devices; and/or general purpose machines. In addition, those of ordinary skill in the art will recognize that devices of a less general purpose nature, such as hardwired devices, field programmable gate arrays (FPGs), application specific integrated circuits (ASICs), or the like, may also be used without departing from the scope and spirit of the inventive concepts disclosed herein.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC § 112, ¶6.

What is claimed is:

1. A method for fabricating a printed circuit, comprising:
   a) darkening a surface location of a conductive material with one or more ultrafast pulses of laser radiation from an ultrafast laser controlled by a controller;
   b) ablating the conductive material at the surface location with one or more longer duration pulses of laser radiation from a longer pulse duration, longer wavelength pulsed laser controlled by the controller, wherein the longer duration pulses of laser radiation are of longer wavelength than the ultrafast pulses of laser radiation.

2. The method of claim 1 further comprising
   c) ablating an insulative layer at the surface location with one or more additional longer duration pulses of laser radiation;
   d) cleaning a second conductive material under the insulative layer with one or more further longer duration pulses of laser radiation.

3. The method of claim 2 wherein cleaning the second conductive material removes insulative material coupled to the second conductive material at the surface location.

4. The method of claim 2 wherein cleaning desmears or polishes the second conductive material.

5. The method of claim 2 wherein ablating the insulative layer in c) forms a hole from the conductive material through the insulative layer to the second conductive material.

6. The method of claim 5 further comprising, plating an interior wall of the hole with a third conductive material to electrically couple the conductive material and the second conductive material.

7. The method of claim 6 wherein the conductive material, the second conductive material and the third conductive material are comprised of the same metal.

8. The method of claim 2 wherein the conductive material and the second conductive material are comprised of the same metal.

9. The method of claim 1 wherein the surface location comprises a circuit trace.

10. The method of claim 1 wherein the ultrafast pulsed pulses of laser radiation are characterized by a pulse duration ranging from 100 fs to 100 ps.

11. The method of claim 10 wherein the pulse duration is 2-3 picoseconds.

12. The method of claim 1 wherein the ultrafast pulses of laser radiation are pulses of near infrared (IR) laser radiation.

13. The method of claim 12 wherein the near IR laser radiation is characterized by a wavelength of about 1 µm.

14. The method of claim 1 wherein the ultrafast pulses of laser radiation are characterized by a peak power greater than 10 MW.

15. The method of claim 1 wherein the one or more longer duration pulses of laser radiation are characterized by a wavelength in the mid infrared (IR).

16. The method of claim 15 wherein the one or more longer duration pulses of laser radiation are characterized by a wavelength ranging from 9 µm to 20 µm.

17. The method of claim 1 wherein the darkening increases the absorptance of the conductive material to IR radiation.

18. The method of claim 1 wherein the darkening comprises creation of nanostructured ridges on the surface location of the conductive material.

19. An apparatus for fabricating a printed circuit, comprising:
    an ultrafast pulsed laser;
    a longer pulse duration; longer wavelength pulsed laser;
    a laser controller operably coupled to the ultrafast laser and the longer duration laser configured to implement a method, the method comprising:
    a) darkening a surface location of a conductive material with one or more ultrafast pulses of laser radiation from the ultrafast pulsed laser;
    b) ablating the conductive material at the surface location with one or more longer duration pulses of laser radiation from the longer wavelength longer pulse duration laser, wherein the longer duration pulses of laser radiation are of longer wavelength than the ultrafast pulses of laser radiation.

20. The apparatus of claim 19 wherein the ultrafast pulsed pulses of laser radiation are characterized by a pulse duration ranging from 100 fs to 100 picoseconds.

21. The apparatus of claim 20 wherein the pulse duration is about 3 picoseconds.

22. The apparatus of claim 19 wherein the ultrafast pulses of laser radiation are pulses of near infrared (IR) laser radiation.

23. The apparatus of claim 22 wherein the near IR laser radiation is characterized by a wavelength of about 1 μm.

24. The apparatus of claim 19 wherein the ultrafast pulses of laser radiation are characterized by a peak power of greater than 10 MW.

25. The apparatus of claim 19 wherein the one or more longer duration pulses of laser radiation are characterized by a wavelength in the mid infrared (IR).

26. The apparatus of claim 25 wherein the one or more longer duration pulses of laser radiation are generated by a CO2 laser.

27. The apparatus of claim 19 further comprising laser optics for scanning the ultrafast pulsed laser and the longer duration laser.

28. The apparatus of claim 19 further comprising a work piece stage for holding the workpiece and moving the work piece in relation to lasers.

\* \* \* \* \*